United States Patent [19]
Chang et al.

[11] Patent Number: 5,872,489
[45] Date of Patent: Feb. 16, 1999

[54] INTEGRATED TUNABLE INDUCTANCE NETWORK AND METHOD

[75] Inventors: Mau Chung F. Chang, Thousand Oaks; Henry O. Marcy, 5th, Camarillo; Deepak Mehrotra, Thousand Oaks; Kenneth D. Pedrotti, Thousand Oaks; David R. Pehlke, Thousand Oaks; Charles W. Seabury, Calabasas; Jun J. Yao, Thousand Oaks, all of Calif.; James L. Bartlett, Cedar Rapids, Iowa; J. L. Julian Tham, Irvine, Calif.

[73] Assignee: Rockwell Science Center, LLC, Thousand Oaks, Calif.

[21] Appl. No.: 848,137

[22] Filed: Apr. 28, 1997

[51] Int. Cl.$^6$ .............................. H03B 5/08; H03J 5/24; H03F 3/04

[52] U.S. Cl. .......................... 331/179; 257/531; 330/305; 331/181; 334/56; 336/200

[58] Field of Search ................................ 334/56, 57, 71; 330/305; 331/179, 181; 200/181; 336/200; 257/531

[56] References Cited

U.S. PATENT DOCUMENTS

| | | | |
|---|---|---|---|
| 2,295,173 | 9/1942 | Hoffmann et al. | 334/56 X |
| 2,296,100 | 9/1942 | Foster et al. | 334/56 X |
| 3,087,110 | 4/1963 | Tomonoh et al. | 334/71 |
| 3,427,569 | 2/1969 | Abramson | 334/56 X |
| 4,564,843 | 1/1986 | Cooper | 334/56 X |
| 4,613,824 | 9/1986 | Rinderle | 330/305 X |
| 4,701,732 | 10/1987 | Nestlerode | 334/56 |
| 5,416,356 | 5/1995 | Staudinger et al. | 257/531 |
| 5,578,976 | 11/1996 | Yao | 333/262 |

OTHER PUBLICATIONS

William H. Hayt, Jr., Jack E. Kemmerly, *Engineering Circuit Analysis*, McGraw–Hill, Inc.. 1971, pp. 396–408.
Richard C. Dorf, *The Engineering Handbook*, CRC Press, 1993, pp. 1011–1013.
J. Jason Yao, M. Frank Chang, "A Surface Micromachines Miniature Switch For Telecommunications Applications With Signal Frequencies From DC up to 4 GHZ", Tech. Digest, 1995, pp. 384–387.
W.T. Wang, *Introduction to Semiconductor Technology*, John Wiley & Sons, 1990, pp. 422–433.

*Primary Examiner*—Paul Gensler
*Attorney, Agent, or Firm*—Koppel & Jacobs

[57] ABSTRACT

An integrated, tunable inductance network features a number of fixed inductors fabricated on a common substrate along with a switching network made up of a number of micro-electromechanical (MEM) switches. The switches selectably interconnect the inductors to form an inductance network having a particular inductance value, which can be set with a high degree of precision when the inductors are configured appropriately. The preferred MEM switches introduce a very small amount of resistance, and the inductance network can thus have a high Q. The MEM switches and inductors can be integrated using common processing steps, reducing parasitic capacitance problems associated with wire bonds and prior art switches, increasing reliability, and reducing the space, weight and power requirements of prior art designs. The precisely tunable high-Q inductance network has wide applicability, such as in a resonant circuit which provides a narrow bandwidth frequency response which peaks at a specific predetermined frequency, making possible a highly selective performance low noise amplifier (LNA), or in an oscillator circuit so that a precise frequency of oscillation can be generated and changed as needed.

25 Claims, 8 Drawing Sheets

INTEGRATED TUNABLE INDUCTANCE NETWORK AND METHOD

BACKGROUND OF THE INVENTION

1. Field of the Invention

This invention relates to the field of tunable inductors, particularly those which can be integrated.

2. Description of the Related Art

Inductors are found in innumerable electronic circuits, and are particularly prevalent in RF circuitry. The performance of many RF systems depends critically on how precisely specific inductance values can be provided in a circuit, and on the quality factor or "Q" of the circuit's reactive components. Q for an inductor is defined as the maximum amount of energy stored in the magnetic field of the inductor's coils divided by the amount of energy lost by the inductor during one complete cycle of a signal applied to the inductor; for an inductor, Q is given by:

$$Q = \frac{\omega L}{R} \quad \text{(Eq. 1)}$$

where $\omega=2\pi f$ and f is the frequency of the signal applied to the inductor, L is the inductor's inductance value and R is the inductor's resistance.

As is evident by Equation 1, a high resistance value lowers an inductor's Q. This is particularly important when the inductor is employed in a resonant circuit, where the value of Q is directly related to the sharpness of the circuit's frequency response. Many resonant circuits are deliberately designed with high-Q inductors to take advantage of the narrow bandwidth and high frequency selectivity associated with their use.

The inductance value L of an inductor is also important in determining the frequency $\omega_0$ at which a resonant circuit resonates. The resonant frequency $\omega_0$ of a parallel LC circuit is given by:

$$\omega_0 = 1/\sqrt{LC} \quad \text{(Eq. 2)}$$

Thus, the frequency response of a resonant circuit peaks at a frequency determined by the circuit's inductance and capacitance values, and the width of the peak depends on the Q value of the circuit's components. Resonant circuits are discussed, for example, in Hayt and Kemmerly, *Engineering Circuit Analysis*, McGraw-Hill, Inc. (1971), pp. 396–408.

Obtaining high-Q inductors with precise inductance values has traditionally been accomplished by either hand-selecting an inductor having desired characteristics from a batch, or by trimming the inductor as needed after manufacture. However, even state-of-the-art laser trimming methods impose limits on how closely one can get to a desired inductance value, and both hand-selecting and trimming are expensive and labor-intensive.

It is often desirable to fabricate inductors with integrated circuit techniques. Integration enables a circuit's inductors to be made simultaneously with other circuit components, reduces the distance between a circuit's inductors and its other components, eliminates the need for parasitic capacitance-causing wire bonds, and reduces the circuit's space and weight requirements, which are typically at a premium in wireless communications devices. However, integrated inductors are difficult to trim to specific inductance values and require a considerable amount of die area to produce a significant amount of inductance.

One method of providing a precise inductance value in an I.C. requires a number of fixed inductors to be fabricated on a substrate, which are then selectably interconnected with solid-state or off-chip switches to produce a desired value of inductance. However, there are several problems related to the use of solid-state switches, particularly at microwave frequencies and above. Integrated switches capable of handling microwave frequencies are typically implemented with gallium arsenide (GaAs) MESFETs or PIN diode circuits. At signal frequencies above about 900 MHz, such as those used by a cellular phone, these switching devices or circuits typically exhibit an insertion loss in the 'ON' (closed) state of about 0.5 db. These shortcomings practically limit the number of inductors that can be interconnected when the losses incurred by the switches becomes unacceptably high. Additional gain must often be built into a system to compensate for the poor performance of the devices, increasing power dissipation, cost and increasing unit size and weight. The characteristics of GaAs MESFETs and PIN diode switches are discussed, for example, in R. Dorf, *The Electrical Engineering Handbook*, CRC Press (1993), pp. 1011–1013.

Providing switching with PIN diode circuits presents additional problems due to the parasitic capacitances inherently created by their use, which serve to limit the frequency range over which the circuit can operate. Similar problems arise when the necessary switching is provided by off-chip switches, due to the parasitic capacitances that result from the presence of wire bonds.

Another major drawback of using state-of-the-art solid state switches is that they place a considerable amount of resistance in series with the inductor, often severely lowering its Q. A low-Q inductor causes the frequency response of the circuit in which it is used to flatten out, lowering its selectivity and widening its bandwidth, often rendering the circuit impractical for use in wireless communications devices.

SUMMARY OF THE INVENTION

An integrated, tunable inductance network is presented that overcomes the problems noted above, and which features both a precisely selectable inductance value and a high Q.

A number of inductors having fixed values are fabricated on a common substrate. Also fabricated on the substrate is a switching network made up of a number of micro-electromechanical (MEM) switches. The switches selectably interconnect the inductors to form an inductance network having a particular inductance value. The fixed inductors may be interconnected in series, in parallel, or in a series/parallel combination, and may be designed with either equal or unique inductance values. With this flexibility available, a precise value of inductance can be obtained by simply selecting and interconnecting the fixed inductors into a particular configuration.

The preferred MEM switch has a very low insertion loss specification, so that placing one or more switches in series with a given inductor allows the inductor to be switched in and out of the network while introducing a very small amount of resistance, and thus has nearly no negative effect on the inductor's Q. Furthermore, the preferred switches are integrated with the inductors on a common substrate, preferably using common processing steps. Integrating the inductors with MEM switches eliminates the parasitic capacitance problems associated with wire bonds and PIN diodes, increases reliability, and reduces the space, weight and power requirements of prior art designs.

The novel combination of features described above provides for the creation of a precisely tunable high-Q inductance network which has wide applicability, particularly in the field of RF communications. When used in a resonant circuit, the inductance network can be configured to provide a very narrow bandwidth frequency response which peaks at a very specific predetermined frequency, making possible a highly efficient, high performance low noise amplifier (LNA), for example. Similarly, when used in an oscillator circuit, a very precise frequency of oscillation can be generated by employing a particular L value in a resonant circuit.

One way in which the integrated, tunable inductance network can be used is as a highly precise factory-tuned fixed inductor, with the switching network configured at time of fabrication to provide a very precise inductance value, which is retained unless reset at a later date. Alternatively, the network's inductance value can be varied as needed to respond to the changing needs of the circuit in which it is used. For example, an oscillator circuit's output frequency can be changed on the fly by simply changing the network's configuration of interconnected inductors to provide a different L value. The switching network is typically controlled with a control device capable of receiving an external input representing a desired inductance value and producing output signals which actuate the switches necessary to achieve the desired value. When used as a fixed inductor, a memory device can be connected to the control device to store the configuration of switches needed to produce a desired inductance.

Further features and advantages of the invention will be apparent to those skilled in the art from the following detailed description, taken together with the accompanying drawings.

DETAILED DESCRIPTION OF THE INVENTION

Figure 1A:
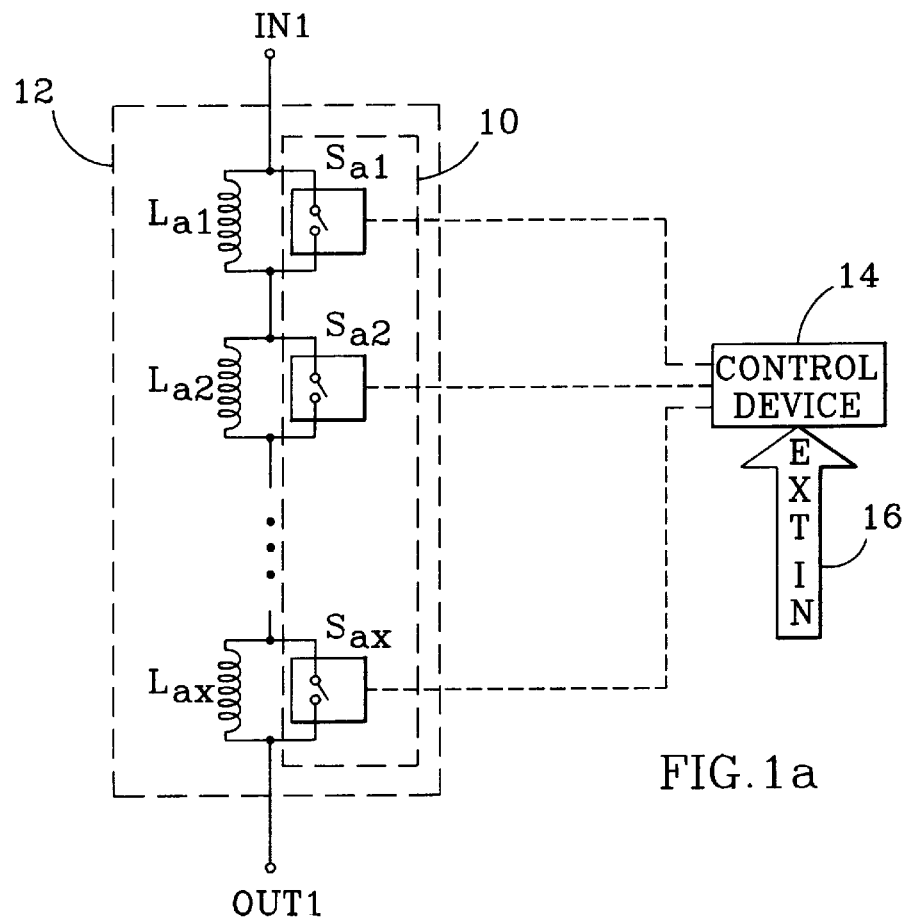
FIGS. 1a, 1b and 1c are schematic diagrams of possible inductance network configurations per the present invention.
Figure 1B:
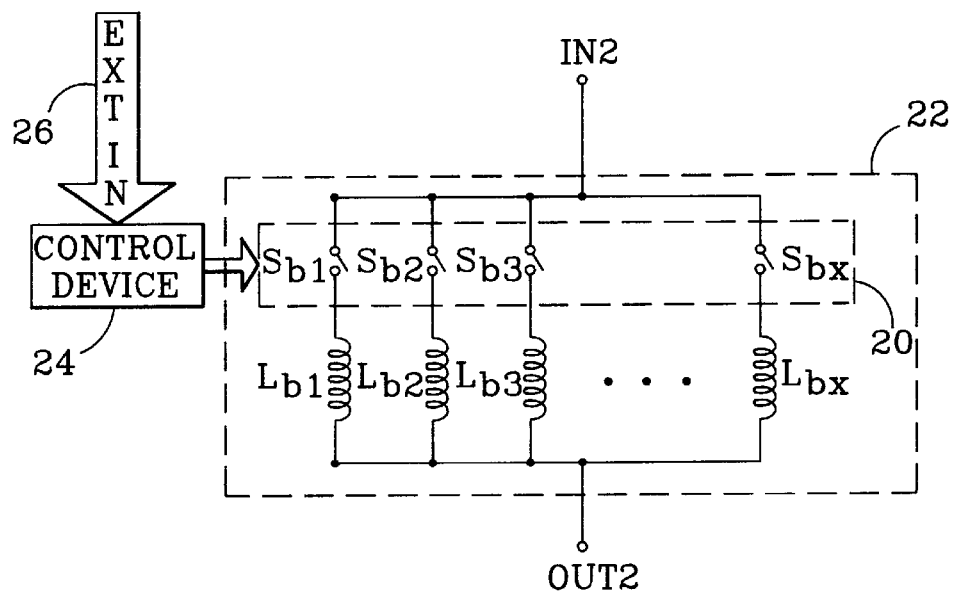
Figure 1C:
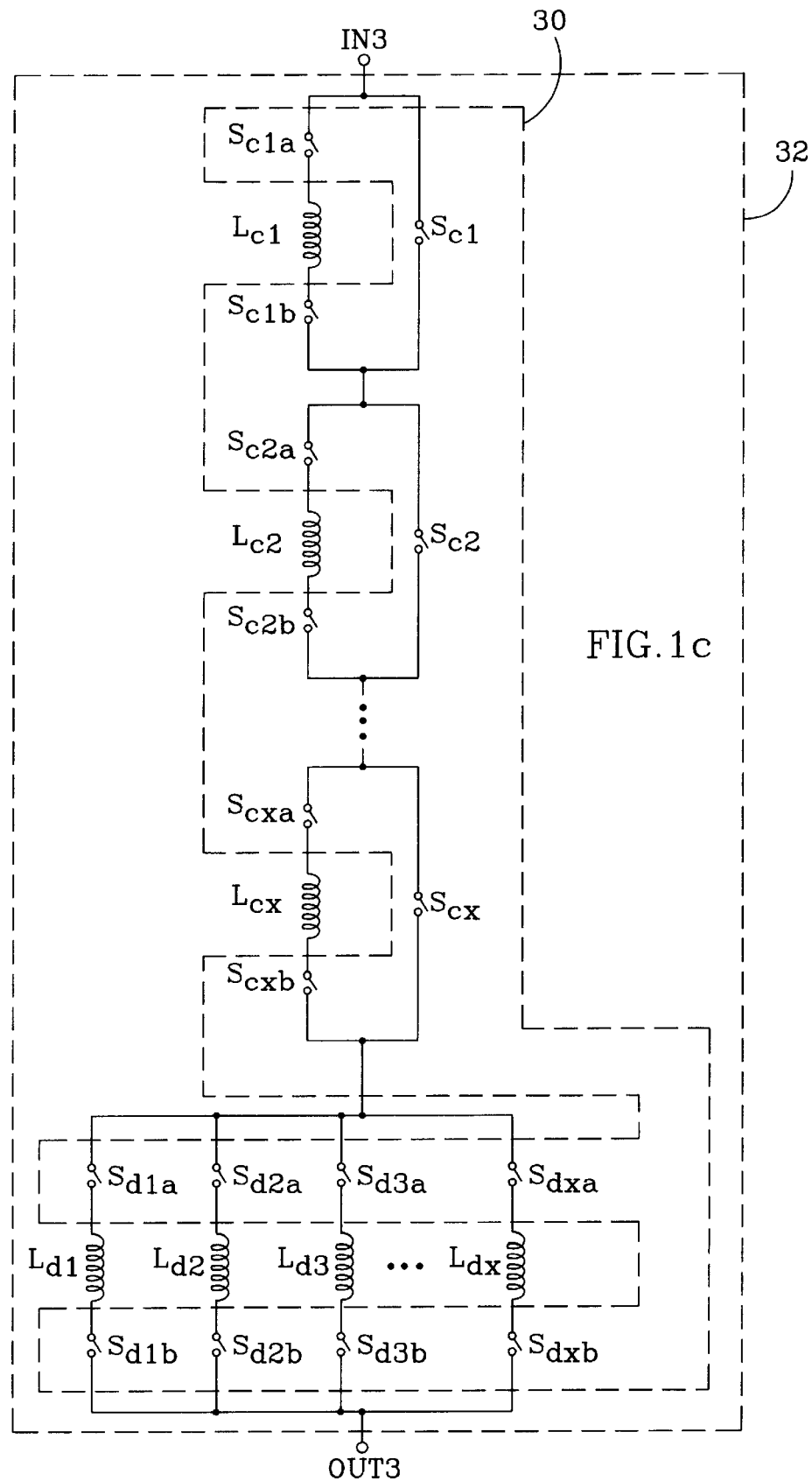

FIGS. 1a, 1b and 1c illustrate several possible ways in which the present invention can be configured. In FIG. 1a, a number X of inductors $L_{a1}, L_{a2}, \ldots, L_{ax}$, are connected together in series. Across each inductor $L_{a1}, L_{a2}, \ldots L_{ax}$ is a respective switch $S_{a1}, S_{a2}, \ldots, S_{ax}$ which, when closed, causes its respective inductor to be bypassed. Switches $S_{a1}, S_{a2}, \ldots, S_{ax}$ form a switching network 10, which in combination with inductors $L_{a1}, L_{a2}, \ldots, L_{a1}$ form a tunable inductance network 12. One side of inductor $L_{a1}$ serves as the input IN1 to the inductance network, and one side of inductor $L_{ax}$ serves as the network's output OUT1. A control device 14 is typically employed to control the state of the switches comprising the switching network.

The inductance network is operated by configuring the switching network as needed to provide a desired inductance. For example, assume that the inductance for each of inductors $L_{a1}, L_{a2}, \ldots, L_{ax}$ is equal to a common value L. The inductance present between the input IN1 and output OUT1 of inductance network 10 is then selectable between a minimum of 1L (i.e., 1×L), accomplished by closing all but one of switches $S_{a1}, S_{a2}, \ldots, S_{ax}$, to a maximum of XL, obtained by opening all of switches $S_{a1}, S_{a2}, \ldots, S_{ax}$ so that none of the inductors is bypassed. Steps of 2L, 3L, . . . , (X–1) L are available in between the minimum and maximum by closing and opening switches appropriately. Closing all of the switches bypasses all of the switches, providing an inductance of nearly zero between IN1 and OUT1.

Greater resolution may be obtained by making the inductance value of at least some of the inductors small. For example, assume inductance network 12 includes 4 inductors $L_{a1}$–$L_{a4}$, with $L_{a1}$=1 $\mu$H, $L_{a2}$=0.5 $\mu$H, $L_{a3}$=0.24 $\mu$H and $L_{a4}$=0.1 $\mu$H. This configuration offers good resolution between 1 $\mu$H and 2 $\mu$H, but at the cost of a smaller overall inductance range than would be present if each inductor were equal to 1 $\mu$H, for example.

The switching network 10 enables the inductance network to be "tunable", i.e., to have an inductance value which can be varied. The resolution of an inductance value obtainable with conventional trimming techniques is subject to certain physical limitations. The resolution of a tunable inductor per the invention is practically unlimited, since fine trimming can be done by switching very small inductors into and out of the inductance network.

Because of the inductance value tolerance limitations inherent in prior art inductors, inductors used in resonant circuits often are deliberately designed with a low value of Q. A lower Q value broadens the circuit's bandwidth, so that the passband resulting from less-than-perfect values of L will still pass the frequency of interest. Because of the precision with which an inductance value can be provided with the invention, there is no longer a need to compromise the value of Q.

One key to achieving both high-Q and precise tunability is the use of very low resistance switches to interconnect the fixed inductors, since any resistance presented by an inductor lowers its Q (per Equation 1 above). In an inductance network as described herein, the resistance of concern is primarily that introduced by the switching devices. The insertion loss introduced by prior art switches such as GaAs MESFETs and PIN diode circuits, particularly at frequencies of 900 MHz and above, can be as high 0.5 db. These losses not only impose possibly unacceptable inefficiencies on the circuitry in which the switches are used, but also lower the Q of the circuitry's inductive components to a point at which the frequency selectivity needed by a communications device cannot be attained.

Switches $S_{a1}, S_{a2}, \ldots, S_{ax}$ are preferably microelectromechanical (MEM) switches. A MEM switch as used herein refers to a device having at least one movable metal contact which bridges a gapped signal path when made to move from an "open" position to a "closed" position, typically in response to the application of an actuation signal, and which can be implemented on an I.C. substrate using well-known I.C. fabrication techniques. Switches of this type offer insertion losses as low as 0.1 db at high frequencies, thus making them well-suited for use in a tunable inductance network per the present invention. Circuit inefficiencies and negative effects on Q are substantially reduced when the switching network uses a MEM switch, which make the fabrication of a practical high-Q precisely tunable inductance network possible.

The preferred MEM switch has at least one top electrode positioned on a cantilever arm which extends over at least one bottom electrode positioned on an I.C. substrate. When an actuation voltage is applied across the top and bottom electrodes, the cantilever arm is electrostatically drawn toward the substrate and one or more contact electrodes affixed to the substrate side of the cantilever arm bridge one or more gapped signal lines on the substrate surface, creating continuous signal paths. MEM switches as discussed herein are discussed in Yao and Chang, "A Surface Micromachined Miniature Switch for Telecommunications Applications with Signal Frequencies from DC up to 4 GHz," In Tech. Digest (1995), pp. 384–387 and in U.S. Pat. No. 5,578,976 to Yao, which is assigned to the same assignee as the present application.

An inductance network 12 per the present invention preferably includes a control device 14 which causes the switches in the switching network 10 to be actuated as appropriate to achieve a desired inductance value. The control device 14, such as a microprocessor, for example, typically acts in response to an external input 16 which is representative of the desired inductance.

A schematic diagram of another possible embodiment of the invention is shown in FIG. 1b. A number of inductors $L_{b1}$, $L_{b2}$, ..., $L_{bx}$ are configured in parallel, with each inductor having a respective switch $S_{b1}$, $S_{b2}$, ..., $S_{bx}$ connected in series with it; the switches form a switching network 20 which in combination with the inductors $L_{b1}$, $L_{b2}$, ..., $L_{bx}$ form an inductance network 22. The network 22 has an input IN2 connected to one side of the switching network and each of the inductors is connected together on one side to form the network's output OUT2. As with the network of FIG. 1a, the inductance value presented between IN2 and OUT2 is set by manipulating the state of the switches making up switching network 20. Any single inductor is imposed into the signal path by closing its respective switch; when the switches of more than one inductor are closed, a parallel combination of the selected inductors is formed. Each inductor in the network can be fabricated to have the same inductance value, or each can have a unique inductance value. For example, a four-inductor configuration in which the inductors have values of L, L/2, L/4 and L/16, respectively, offers a 16:1 range of inductance values if selected singly, and good resolution when combined in parallel. As with the series network shown in FIG. 1a, parallel inductance network 22 would typically be controlled by a control device 24 which sets the network's inductance value by actuating the switches making up the switching network 20 in response to an external input 26.

FIG. 1c shows an embodiment of the invention in which a number of inductors can be interconnected in a series/parallel combination. Inductors $L_{c1}$, $L_{c2}$, ..., $L_{cx}$ are arranged to be selectably connected together in series, with each inductor having a respective bypass switch $S_{c1}$, $S_{c2}$, ..., $S_{cx}$ across it. One end of switch $S_{cx}$ is connected to a number of inductors $L_{d1}$, $L_{d2}$, ..., $L_{dx}$ arranged to be connected together in parallel.

Also shown in FIG. 1c are pairs of switches $S_{c1a}/S_{c1b}$, $S_{c2a}/S_{c2b}$, ..., $S_{cxa}/S_{cxb}$ and $S_{d1a}/S_{d1b}$, $S_{d2a}/S_{d2b}$, ..., $S_{dxa}/S_{dxb}$ around respective inductors, with one switch of each pair connected in series with one end of its respective inductor and the second switch of the pair connected in series with the inductor's other end. Each switch of the pair must be closed for its respective inductor to contribute to the inductance network. Each of the switches $S_{c1a}/S_{c1b}$, $S_{c2a}/S_{c2b}$, ..., $S_{cxa}/S_{cxb}$, $S_{d1a}/S_{d1b}$, $S_{d2a}/S_{d2b}$, ..., $S_{dxa}/S_{dxb}$, and $S_{c1}$, $S_{c2}$, ..., $S_{cx}$ form a switching network 30 which, in combination with inductors $L_{c1}$, $L_{c2}$, ..., $L_{cx}$ and $L_{d1}$, $L_{c2}$, ..., $L_{dx}$, comprise an inductance network 32. One end of switch $S_{c1}$ serves as an input IN3 to the network 32, and switches $S_{d1b}$, $S_{d2b}$, ..., $S_{dxb}$ are each connected together on one side to form the network's output OUT3. Manipulating switching network 30 so that some of inductors $L_{c1}$, $L_{c2}$, ..., $L_{cx}$ and some of inductors $L_{d1}$, $L_{d2}$, ..., $L_{dx}$ are selected to contribute to the network forms a series/parallel combination of inductors, which offers more flexibility in obtaining a specific inductance value from the network 32. For example, a desired inductance value could be obtained by using series inductors $L_{c1}$, $L_{c2}$, ..., $L_{cx}$ as a coarse inductance value adjustment, with the parallel inductors $L_{d1}$, $L_{d2}$, ..., $L_{dx}$ selected as necessary to provide a fine adjustment. A parallel/series combination of inductors can be similarly implemented by swapping the respective positions of the parallel inductors $L_{d1}$, $L_{d2}$, ..., $L_{dx}$ (and their associated switches) and the series inductors $L_{c1}$, $L_{c2}$, ..., $L_{cx}$.

The pairs of switches around each inductor serve to completely isolate the inductor when it is not selected. When only one end of an inductor is disconnected from the inductance network, the end that is still connected may cause the inductor to contribute unwanted parasitic capacitance to the network. Problems may also arise from electromagnetic radiation generated by an inductor coil which remains connected at one end, particularly with large coils. The "dual switching" approach provided by the switch pairs is preferred when the presence of these conditions would cause an unacceptable level of performance degradation in the circuit in which the inductors are used. However, the use of dual switching does require additional I.C. die space, as two to three times as many switches are required.

Though the preferred MEM switches introduce very low values of resistance into an inductance network built per the present invention, there are practical limitations on the number of inductors which should be interconnected. As the number of switches interconnected in series increases, and/or the number of switches interconnected in parallel decreases, the overall resistance contributed by the switches goes up. Per Equation 1, as R increases, Q decreases. At some value of R, the value of Q becomes so low that the system specifications can no longer be met. The power required to operate the switches may also impose a limitation on the number of switches which can be accommodated in a system, particularly one that is battery-powered.

The embodiments shown in FIGS. 1a, 1b and 1c are intended as merely illustrative. An inductance network per the present invention can be configured as needed for a specific application, with consideration given to factors such as desired inductance range, desired resolution, number of inductance steps available between minimum and maximum inductance values, power dissipation, and desired Q.

Another advantage offered by the invention is found when considering the fabrication of an inductance network, in that both the preferred MEM switches and the inductors comprising the network may be integrated on a common substrate using common processing steps. One possible fabrication sequence illustrating the integration of a MEM switch and an inductor is depicted in FIGS. 2a–2h (plan views) and 3a–3h (corresponding cross-sectional views). The fabrication sequence shown, which includes only one switch and one inductor, is intended to merely illustrate the process. An inductance network per the present invention includes a number of switches and inductors, so that the sequence shown is necessarily repeated as needed to create a complete network.

Figure 2A:
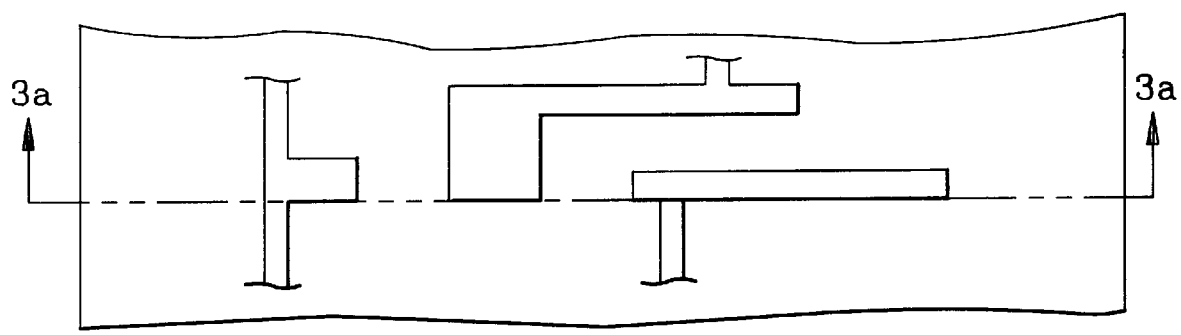
FIGS. 2a–2h are plan views showing a fabrication sequence for integrating inductors and MEM switches per the present invention.
Figure 3A:
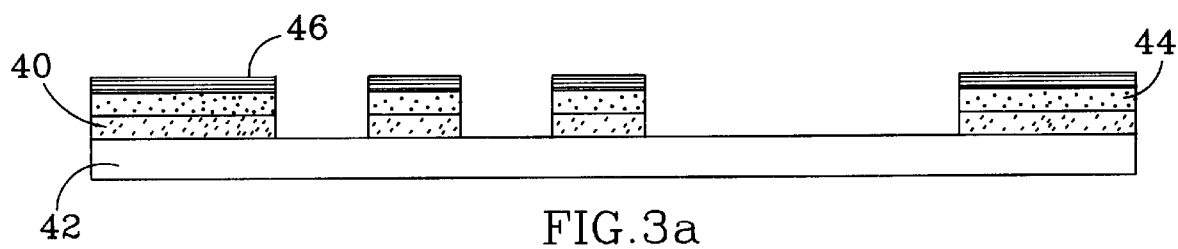
FIGS. 3a–3h are cross-sectional views which correspond with FIGS. 2a–2h, respectively, showing a fabrication sequence for integrating inductors and MEM switches per the present invention.
Figure 2B:
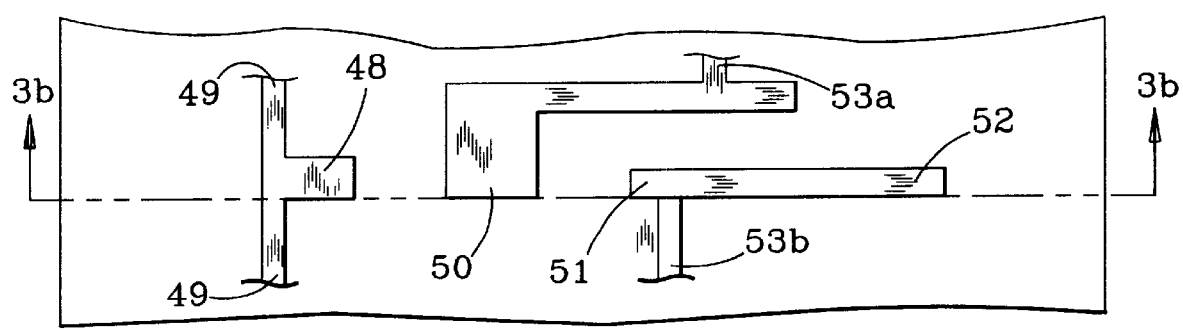
Figure 3B:
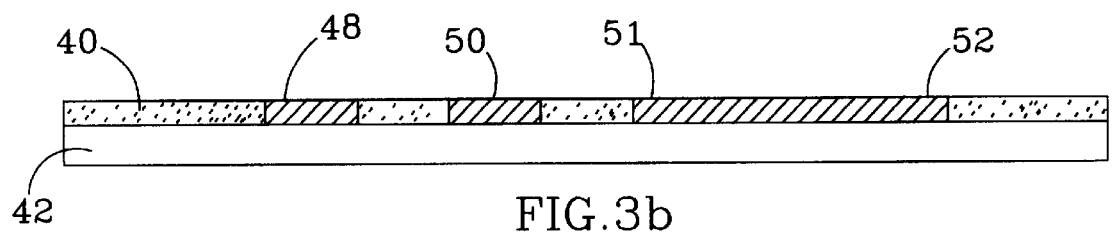
Figure 2C:
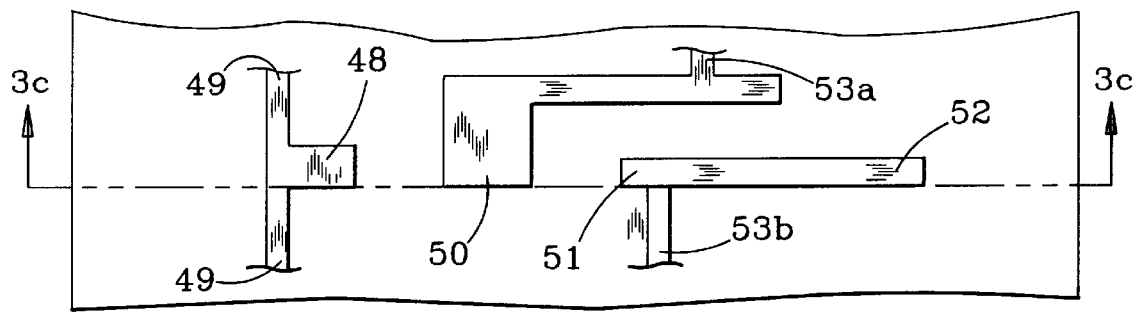

As shown in FIG. 3a (layers not shown in FIG. 2a), a first sacrificial material 40, such as a layer of thermal setting polyimide, is deposited on a substrate 42. A second sacrificial layer, such as a layer of pre-imidized polyimide 44 that can be selectively removed from the first sacrificial layer, is then deposited. A layer of silicon nitride 46, preferably about 1500 Å thick, is then deposited and patterned using photolithography and reactive ion etching (RIE) in $CHF_3$ and $O_2$ chemistry. The pattern is transferred to the underlying polyimide layers using $O_2$ RIE, resulting in the cross-section shown in FIG. 3a. This creates a "lift-off" profile compatible with the selective deposition of metal into the distinct open areas. In FIGS. 2b and 3b, a layer of metal is deposited, preferably by electron beam evaporation, which is about equal in thickness to the first sacrificial layer 40. The second sacrificial layer 44, the silicon nitride layer 46 and the metal on top of it are then dissolved away in a solution such a methylene chloride, retaining the metal in the original open areas along with the first sacrificial layer 40. This first metal layer defines the bottom electrode 48 of a MEM switch and the traces 49 which carry a voltage to the electrode, and two metal traces 50 and 51 which form the gapped signal line which is bridged when the switch is actuated. The end of trace 51 which is not adjacent to trace 50 forms the center tap 52 of what will become an inductor. Traces 50 and 51 also include metal interconnection runs 53a and 53b which connect, for example, to other switches and inductors which make up an inductance network.

Figure 3C:
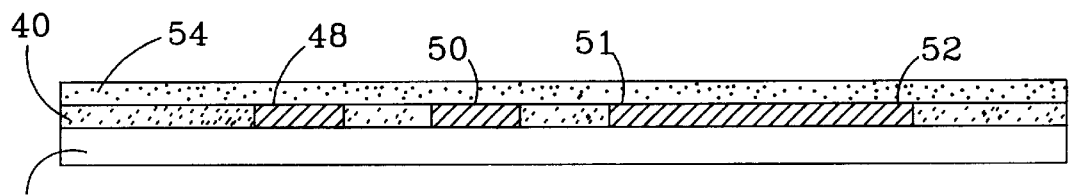
Figure 2D:
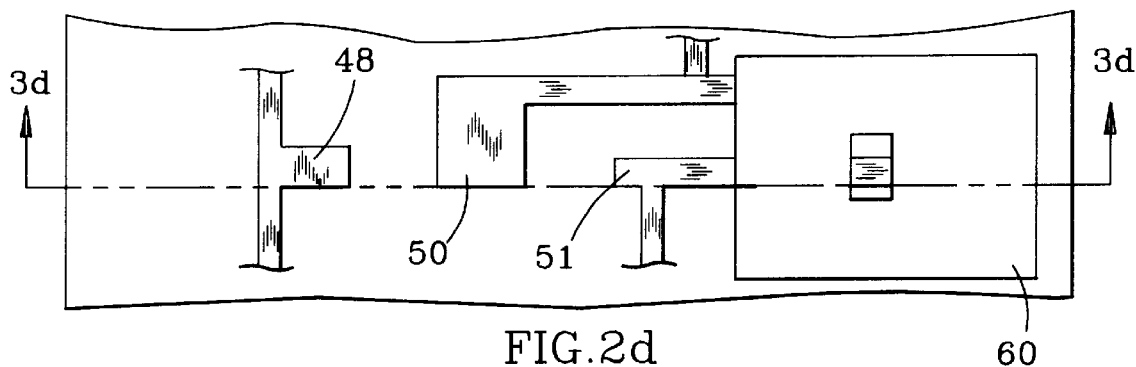
Figure 3D:
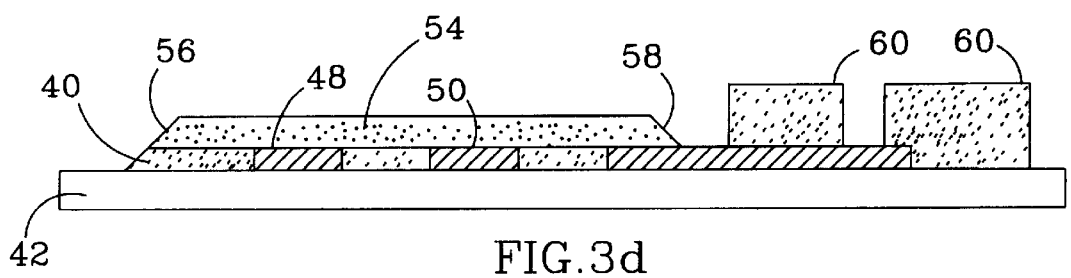

Next, an additional sacrificial polyimide layer 54 is deposited (FIG. 3c, not shown in FIG. 2c) and patterned to form sloping sidewalls 56 and 58 using $O_2$ RIE (FIG. 3d, not shown in FIG. 2d), and a selective deposition of a thick insulating material, preferably silicon dioxide, forms support post 60 for the inductor coils (FIGS. 2d and 3d).

Figure 2E:
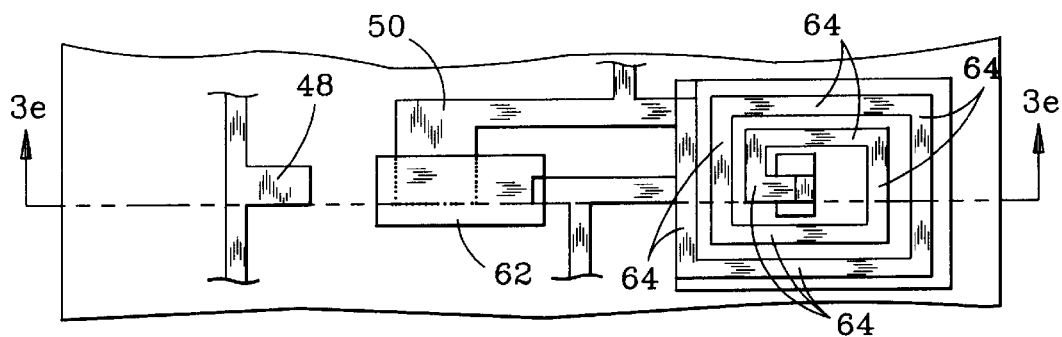
Figure 3E:
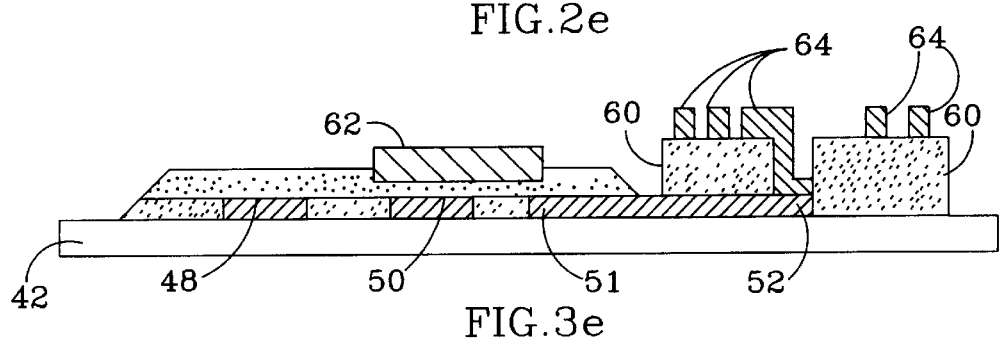

As shown in FIGS. 2e and 3e, another layer of metal is deposited and patterned to form the switch's contact electrode 62 and the inductor coils 64 (orthogonal portions of the coils not shown in FIG. 3e for clarity). For reasons discussed below, the area where the contact electrode 62 will reside is preferably treated in an $O_2$ RIE plasma to etch a small amount, preferably 2000 Å–5000 Å, into the topmost sacrificial layer 54, so that the electrode is slightly recessed into the layer.

Figure 2F:
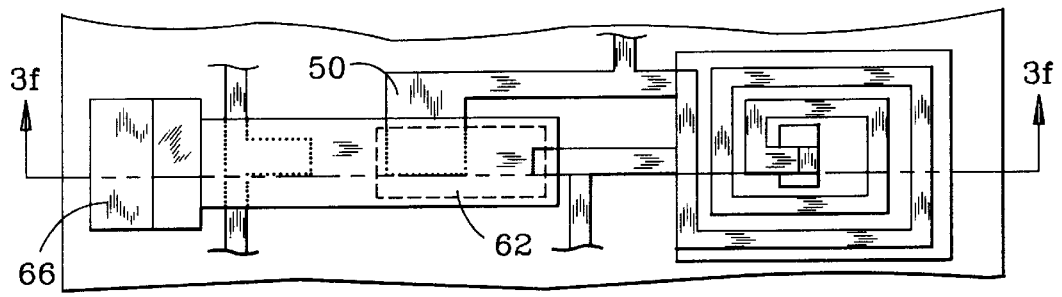
Figure 3F:
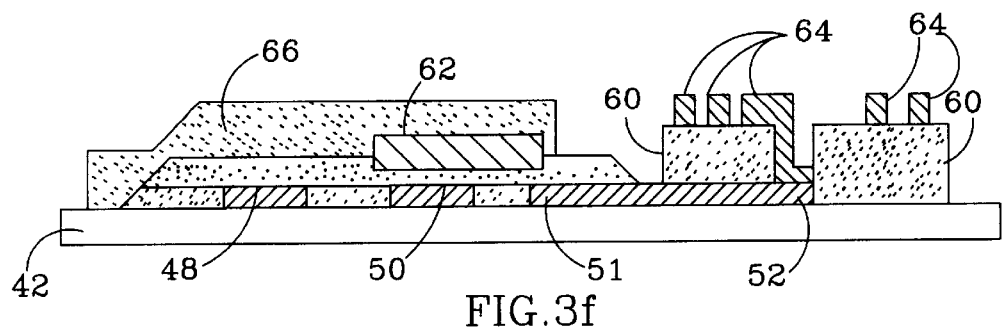
Figure 2G:
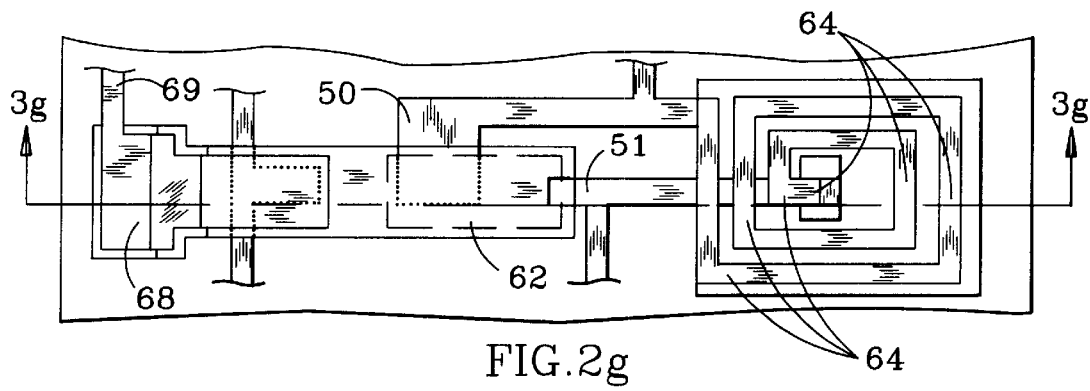
Figure 3G:
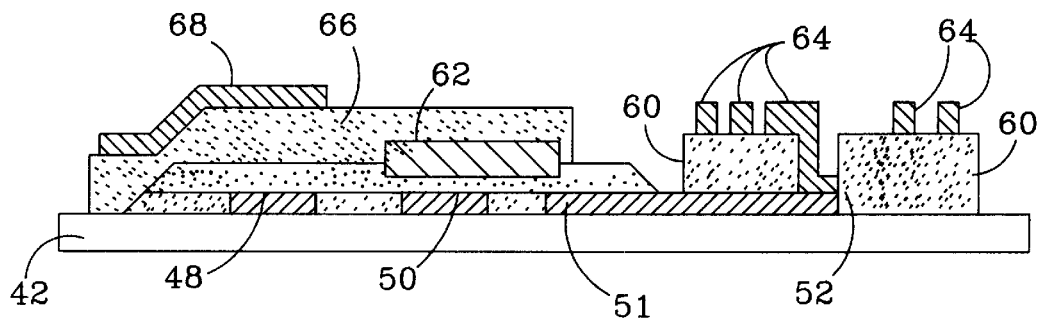

In FIGS. 2f and 3f, a cantilever arm 66 is formed from a layer, preferably about 2 μm thick, of PECVD silicon dioxide, patterned and etched with $CHF_3$ and $O_2$ RIE. In FIGS. 2g and 3g, a layer of metal, preferably aluminum about 2500 Å thick, is deposited, preferably using electron beam evaporation and lift-off, to form a top electrode 68 for the switch. The top electrode 68 preferably comes down the sidewall 56 and a metal trace 69 extends from it; a voltage is applied to the top electrode via trace 69 to actuate the switch.

Figure 2H:
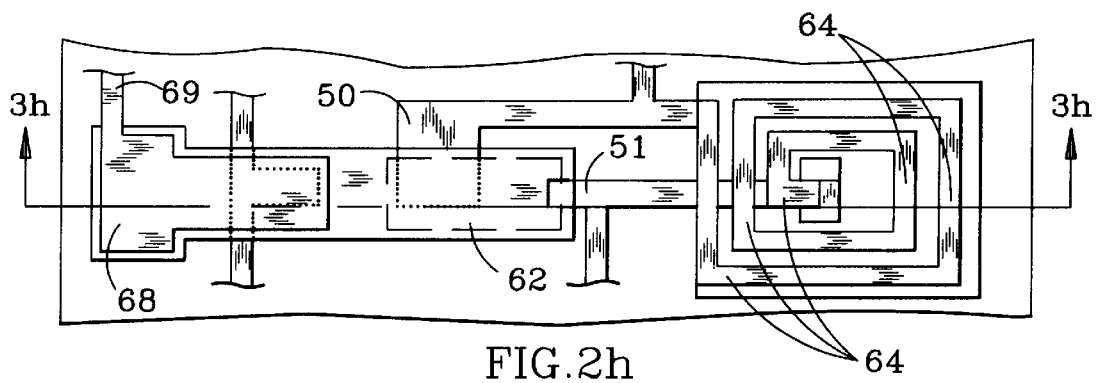
Figure 3H:
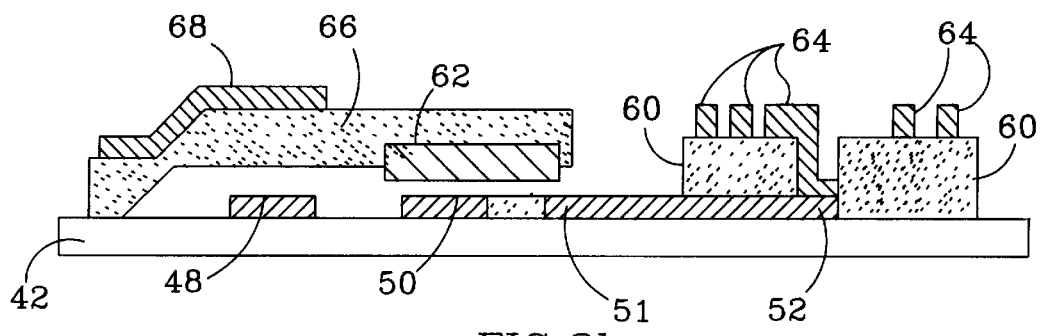

In FIGS. 2h and 3h, the sacrificial layers are removed, preferably with an unpatterned $O_2$ etch using a Branson $O_2$ barrel etcher, to remove all remaining polyimide layers on the substrate surface, including those under the cantilever arm 66. This allows the arm 66 to flex downward in response to an actuation voltage applied across the top electrode 68 via trace 69 and the bottom electrode 48 via trace 49, causing contact electrode 62 to bridge the gap between traces 50 and 52. Traces 53a and 53b provide connections to the outer coil and center tap 52 of the inductor, respectively, as well as to the other inductors and switches which make up the inductance network. When configured as shown, closing the MEM switch causes the inductor to be short circuited and effectively bypassed. When the switch is open, a signal applied to trace 53a is passed through the inductor's coils 64 and continues down trace 53b to other components of the inductance network.

As mentioned above, top electrode 62 is preferably slightly recessed into sacrificial layer 54. This is to ensure that when the switch is actuated, the contact electrode 62 bridges the traces 50, 51 before the cantilever arm comes into contact with the bottom electrode 48.

The substrate is not limited to any particular material, and is properly chosen based on other system considerations. For example, a glass substrate is inexpensive, allows large inductors to be formed on it, and reduces parasitic capacitance between the inductors and the substrate. Silicon or GaAs substrates may be preferable, however, if the inductance network is being integrated with other components which require the same substrate material. For example, wireless communications devices often use high-speed active devices which must be fabricated on a semi-insulating GaAs substrate. A device which utilized the present inductance network could integrate its active devices with the inductance network on a common GaAs substrate.

The metal which forms the inductor coils is preferably made as thick as possible, to reduce their resistance and to increase the inductor's Q. However, the switch's contact electrode 62 is formed with the same deposition step as the coils and may become too heavy if made too thick, so that a compromise is necessary between coil thickness and contact thickness. The necessity of making this compromise can be avoided if an alternative fabrication sequence is followed in which the inductors are fabricated on the substrate first, without simultaneously building up the switches. When the inductor fabrication is complete, the sequence picks up with the deposition of the polyimide layers 40 and 44 and the silicon nitride layer 46 as shown in FIG. 2a. These layers serve to protect the inductors while the switches are built up; all the protective layers are removed when the unpatterned $O_2$ RIE etch step is performed as shown in FIG. 2h. This method requires more processing steps to be executed, but allows for a more flexible choice of inductor design parameters. For example, this approach permits the metal of the inductor coils to be thicker than that of the contact electrode, lowering the resistance of the coils and raising the inductor's Q.

Fabrication of integrated inductors is discussed, for example, in C. T. Wang, *Introduction to Semiconductor Technology*, John Wiley & Sons (1990), pp. 422–433.

The fabrication sequence shown in FIGS. 2a–2h and 3a–3h shows the inductor elevated above the substrate by support post 60. This arrangement is preferred because it reduces parasitic capacitance between the inductor coils and the substrate. Alternatively, the coils can be fabricated directly on an insulating substrate, with the center tap brought out over the coils via the use of air bridges.

Figure 4A:
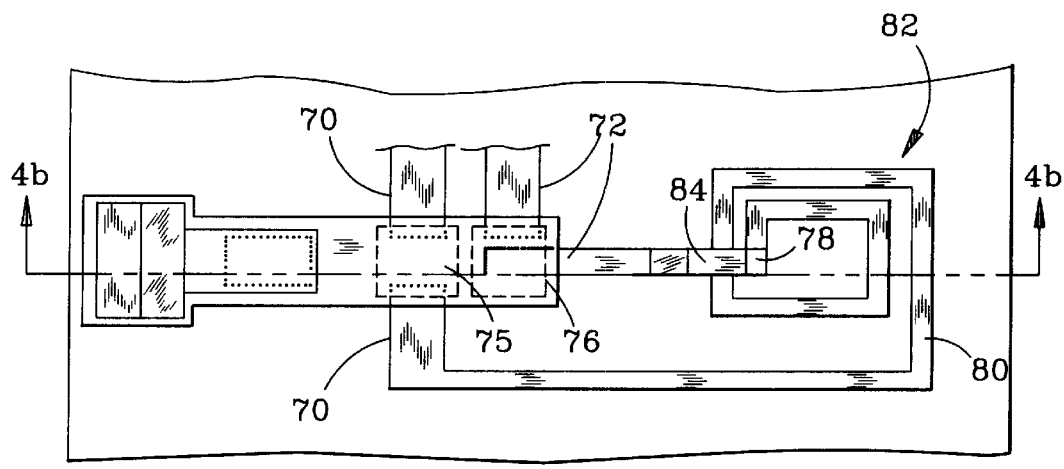
FIGS. 4a and 4b are plan and cross-sectional views, respectively, of an inductance network utilizing a MEM switch which features two contact electrodes.
Figure 4B:
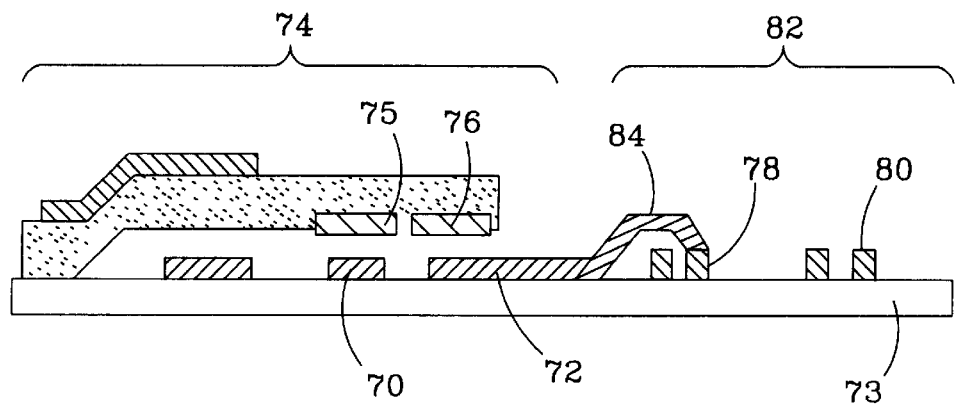

To implement the dual-switching approach discussed in conjunction with FIG. 1c, it is preferred that MEM switches be used which have the capability to bridge two independent gapped signal lines when closed. This capability is attained by including two contact electrodes on the switch's cantilever arm rather than the single contact electrode 62 shown in FIGS. 2e–2h and 3e–3h. A double-throw MEM switch with two contact electrodes integrated with an inductor is shown in FIG. 4. Two gapped signal lines 70 and 72 are positioned on a substrate 73 below a MEM switch 74. The switch 74 has two contact electrodes 75 and 76, with electrode 75 positioned to bridge gapped signal line 70 when closed, and electrode 76 positioned to bridge gapped signal line 72 when closed. When the switch 74 is actuated, a connection is made to both the center tap 78 and the outer coil 80 of an inductor 82. Contact electrodes 75 and 76 are preferably configured so that signal lines 70 and 72 are bridged nearly simultaneously when switch 74 is actuated, as well as opened nearly simultaneously when the switch is opened. Nearly simultaneous closure is preferred because reactive energy stored in the inductor may otherwise cause waveform distortion in the signal propagating through the inductor. Inductor 82 is shown fabricated directly on the substrate 73, with connection to the center tap 78 provided by an air bridge 84. When an inductor's coils lie directly on the substrate 73, the substrate must be an insulating substrate to prevent the coils from being shorted together.

The MEM switch depicted in FIGS. 2, 3 and 4 represent only two of many possible configurations of such a switch. The cantilever arm and electrodes may be formed in various geometries and using various materials as appropriate for a given end use. However, the low loss characteristics provided by using one or more movable metal contacts to make electrical connections is essential to realizing the benefits of the invention herein claimed.

Figure 5:
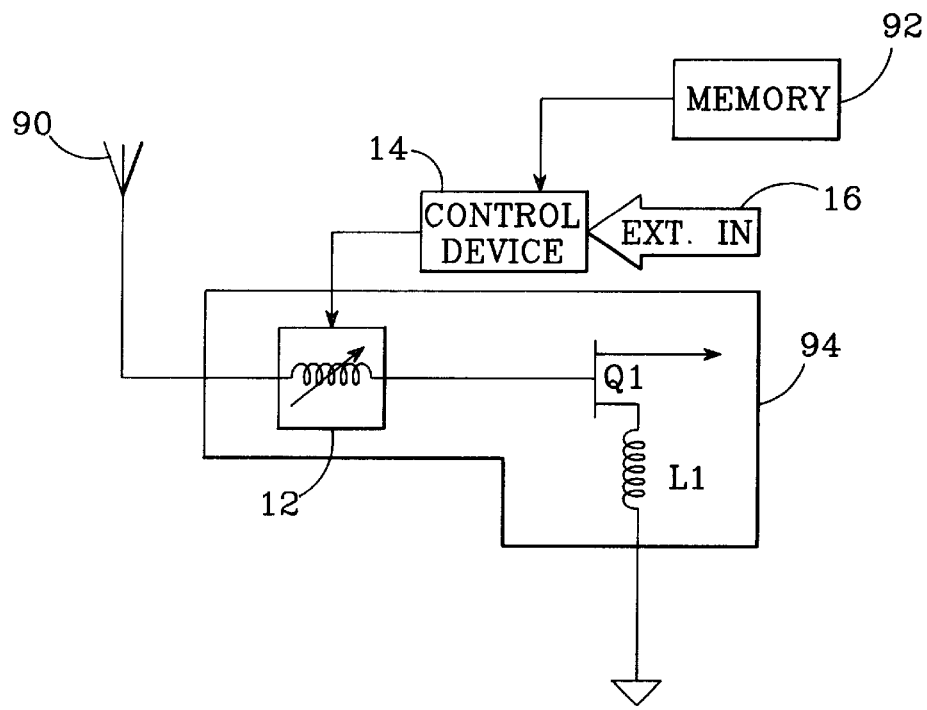
FIG. 5 is a schematic diagram of an inductance network used as a component of a low noise amplifier (LNA) front end.

An integrated, tunable inductance network per the present invention has many applications. In FIG. 5, the inductance network 12 is used as a component of a front end circuit for a low noise amplifier (LNA), which would typically be used to amplify signals received by an antenna 90. Signals received by the antenna are passed through tunable inductance network 12 to the control input of an active device Q1. In an LNA application, Q1 is usually a GaAs FET (shown) or a bipolar junction transistor. A fixed inductor L1 is connected between Q1's source and ground, and Q1's drain serves as the output of the front end circuit. The inductance network 12 is preferably controlled by a control device 14, which typically sets the switches in the network in response to an external input 16.

Fixed inductor L1 and inductance network 12 form a resonant circuit that determines the front end's frequency response; the circuit's resonant frequency is dependent on the inductance value of the network 12. Having a tunable inductance value in an LNA application provides advantages in at least two ways. An LNA in a cordless phone, for example, ideally amplifies incoming signals of one specific frequency only, such as 900 MHz, while blocking all other frequencies. Use of an inductor with a high Q produces a sharp peak at the resonant frequency, but if its L value is slightly off the desired inductance, the LNA may have much less gain at the desired frequency. Since it is difficult to obtain a conventional inductor having an L value which is sufficiently close to the desired L value, a lower Q inductor must often be employed to ensure that the frequency of interest will be passed. Using a tunable inductance network reduces the need to compromise the value of Q. The network 12 is simply designed to provide the degree of resolution needed to obtain the specific L value needed by the circuit. Each of the fixed inductors which make up the network can be high-Q, so that a sharp peak is obtained in the frequency response precisely at the desired frequency.

An LNA front end as shown in FIG. 5 can be fabricated on a common substrate 94 (shown schematically), if desired.

As noted above, the invention can be implemented on a variety of substrates, including GaAs, glass and silicon types. The inductance network can thus be integrated with active devices requiring any of these substrate types.

In addition to providing the ultra-fine-tuning capability just described, the tunable inductance network can also be used to permit an LNA to be adaptable for use with different communications standards. For example, the standard frequency for U.S. cellular phone communications is 900 MHz, while the European standard is 1.9 GHz. Using a tunable inductance network enables the LNA to be adapted to either system by simply commanding the network's switching network to interconnect its fixed inductors as needed to provide resonance at one standard or the other. To accommodate the 1 GHz range of this example would require an inductance value adjustment range of about 4:1, which is well within the capabilities of the present invention.

The LNA application shown in FIG. 5 is not limited to the use of series-connected inductance network 12. Any of the configurations described above, including parallel inductance network 22 and combination series/parallel inductance network 32 are equally acceptable, with the particular configuration determined by system requirements. Similarly, the arrangement of components around Q1 is not limited to that shown in FIG. 5, which is intended only to illustrate the invention's use in an LNA application. For example, an LNA having a frequency response peak which is determined by the L value of network 12 and the inductance of L1 can also be implemented with inductor L1 between the antenna 90 and the gate of Q1 and network 12 in Q1's source circuit.

There are two ways in which an inductance network per the present invention would typically be employed: as a high-precision fixed inductor and as a tunable inductor. When a precise inductance value is needed which is to remain at a fixed value, the tunable inductance network can serve as a trimmed inductor, but with a higher degree of accuracy than is attainable with conventional trimming techniques. In this mode, after the network is fabricated, its switching network is operated and its inductance measured until the specific value of L is attained. The final configuration of network switches is preserved; for example (as shown in FIG. 5), a memory device 92 associated with control device 14 can store the switch configuration so that the desired L value can be made available upon demand.

When used as a tunable inductor, the inductance of the inductance network is made to vary in the field as needed. For the LNA application shown in FIG. 5, for example, an external input 16 to the control device 14 may indicate that the resonant frequency of the LNA circuit needs to be changed to accommodate a different frequency standard. The control device would typically be programmed to respond to this input by changing the configuration of switches as necessary to produce the new resonant frequency.

Figure 6:
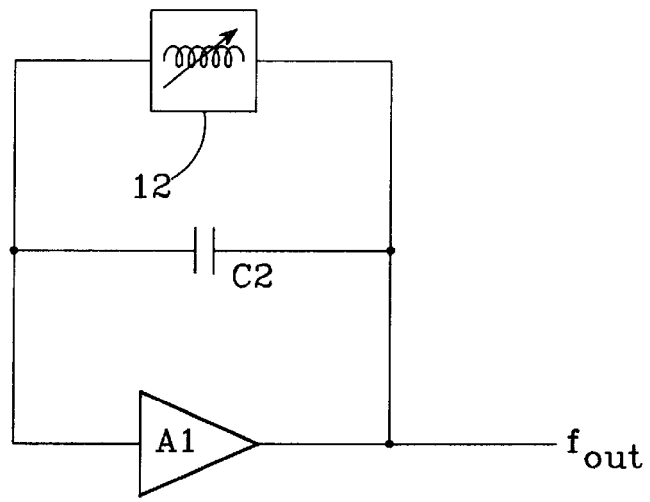
FIG. 6 is a schematic diagram of an inductance network used as a component of an oscillator.

Another application of the present inductance network is in an oscillator circuit having a frequency determined by an L-C network. In FIG. 6, an oscillator is formed from an amplifier A1 which has a capacitor C2 and a tunable inductance network 12 with inductance value L in a feedback path; the values of L and C2 determine the oscillator's output frequency $f_{out}$. The need for a very precise oscillator frequency is common in RF circuits, to provide a local oscillator signal to a down-converter, for example. Use of a tunable inductance network 12 as a high-precision fixed inductor as described above enables a specific fixed frequency to be generated and maintained. Alternatively, the network 12 can be used as a tunable inductor and allow different output frequencies to be generated as needed.

The number of inductors and switches needed to create an inductance network with a wide inductance range and fine resolution may be large, and the die area required to accommodate such a network can also be quite large. For example, assume a series inductance network as shown in FIG. 1a comprises 10 inductors and 10 switches, with the 10 inductors having inductance values of 1L, 0.9L, 0.8L, 0.7L, 0.6L, 0.5L, 0.4L, 0.3L, 0.2L and 0.1L, respectively. This configuration provides an inductance range of between 0 and 5.5L, and a resolution of 0.1L. The die space occupied by each inductor varies with its inductance; a typical area is about $250\mu \times 250\mu$. The preferred MEM switch occupies about 1 mm$\times 300\mu$. Ignoring the necessary spacing between devices on a die, this inductance network would consume about $3.6 \times 10^6 \mu^2$. Though the complexity of the inductance network and the very large die area which it requires are burdensome, the burden is more than offset by the unprecedented accuracy and quality factor specifications made possible by the invention, which enable levels of performance in RF communications equipment that have been heretofore unattainable.

While particular embodiments of the invention have been shown and described, numerous variations and alternate embodiments will occur to those skilled in the art. Accordingly, it is intended that the invention be limited only in terms of the appended claims.

We claim:

1. An integrated, tunable inductance network, comprising:
   a substrate,
   a plurality of inductors fabricated on said substrate, and
   a switching network-which is operable to interconnect selectable ones of said inductors to form an inductance network having an inductance value that depends upon the selected inductors, said inductance network having an input and output, said switching network comprising a plurality of micro-electromechanical (MEM) switches and integrated with said inductors on said substrate, each of said MEM switches switching in response to a respective control signal to set a total inductance across said input and output to one of a plurality of levels.

2. The integrated, tunable inductance network of claim 1, wherein said switching network is arranged to interconnect selected inductors in parallel to form said inductance network.

3. The integrated, tunable inductance network of claim 1, wherein said switching network is arranged to interconnect selected inductors in series to form said inductance network.

4. The integrated, tunable inductance network of claim 1, wherein said switching network is arranged to interconnect selected inductors in a series/parallel combination to form said inductance network.

5. The integrated, tunable inductance network of claim 1, wherein said common substrate is a semi-insulating gallium arsenide (GaAs) substrate.

6. The integrated, tunable inductance network of claim 1, wherein said common substrate is a glass substrate.

7. The integrated, tunable inductance network of claim 1, further comprising a control device connected to said switching network and arranged to operate said switching network to cause said inductance network to present a desired inductance value between said input and output.

8. The integrated, tunable inductance network of claim 7, wherein said switching network comprises a plurality of switches, and each of said plurality of switches is connected to said control device and arranged to operate in response to an actuation signal received from said control device.

9. The integrated, tunable inductance network of claim 7, wherein said control device is arranged to operate said switching network in response to an external input.

10. The integrated, tunable inductance network of claim 1, wherein said switching network includes a respective pair of switches for each of said inductors, each inductor connected in series between its respective switch pair, said pairs of switches operable to completely isolate their respective inductors from said inductance network.

11. The integrated, tunable inductance network of claim 1, wherein said inductors are elevated above said substrate.

12. An integrated, tunable inductance network, comprising:
   a plurality of inductors,
   a switching network which is operable to interconnect selectable ones of said inductors to form an inductance network having an inductance value that depends upon the selected inductors, said inductance network having an input and output, said switching network integrated with said inductors on a common substrate,
   a control device connected to said switching network and arranged to operate said switching network to cause said inductance network to present a desired inductance value between said input and output, and
   a memory device which is connected to said control device and arranged to cause said control device to configure said switching network to produce a desired inductance value between said input and output.

13. An integrated, tunable inductance network, comprising:
   a plurality of inductors, and
   a switching network which is operable to interconnect selectable ones of said inductors to form an inductance network having an inductance value that depends upon the selected inductors, said inductance network having an input and output, said switching network including a respective pair of switches for each of said inductors, each inductor connected in series between its respective switch pair, said pairs of switches operable to completely isolate their respective inductors from said inductance network, each of said pairs of switches implemented with a single double-throw micro-electromechanical switch,
   said switching network integrated with said inductors on a common substrate.

14. A low noise amplifier (LNA) front end, comprising:
   an active device, and
   an integrated tunable inductance network which forms a resonant circuit which is connected to said active device, said inductance network comprising a plurality of fixed inductors and a switching network, said switching network operable to interconnect selectable ones of said fixed inductors to form an inductance network having an inductance value that depends upon the selected fixed inductors, said switching network, said active device, and said fixed inductors integrated together on a common substrate, said switching network comprising a plurality of micro-electromechanical (MEM) switches, each of said MEM switches switching in response to a respective control signal, said active device and inductance network forming an LNA front end having a frequency response which peaks at a frequency which depends on the inductance value of said inductance network.

15. The LNA of claim 14, wherein said common substrate is a semi-insulating gallium arsenide (GaAs) substrate.

16. The LNA of claim 14, further comprising a control device connected to said switching network and arranged to operate said switching network to cause said resonant circuit to resonate at a desired frequency.

17. The LNA of claim 16, wherein said control device is arranged to operate said switching network in response to an external input.

18. A low noise amplifier (LNA) front end, comprising:
an active device,
an integrated tunable inductance network which forms a resonant circuit which is connected to said active device, said inductance network comprising a plurality of fixed inductors and a switching network, said switching network operable to interconnect selectable ones of said fixed inductors to form an inductance network having an inductance value that depends upon the selected fixed inductors, said switching network integrated with said fixed inductors on a common substrate, said active device and inductance network forming an LNA front end having a frequency response which peaks at a frequency which depends on the inductance value of said inductance network,
a control device connected to said switching network and arranged to operate said switching network to cause said resonant circuit to resonate at a desired frequency, and
a memory device which is connected to said control device and arranged to cause said control device to configure said switching network to produce a desired inductance value.

19. A tunable oscillator, comprising:
an amplifier, and
an integrated tunable inductance network which forms a resonant circuit connected to said amplifier, said inductance network comprising a plurality of fixed inductors and a switching network, said switching network operable to interconnect selectable ones of said fixed inductors to form an inductance network having an inductance value that depends upon the selected fixed inductors, said switching network comprising a plurality of micro-electromechanical (MEM) switches, each of said MEM switches switching in response to a respective control signal, said switching network integrated with said fixed inductors on a common substrate to form a tunable oscillator that produces an output signal having a frequency which varies with the inductance value of said inductance network.

20. A method of providing a precise inductance value, comprising the steps of:

determining a desired inductance value, and electrically operating an integrated switching network to interconnect a plurality of integrated inductors into an inductance network having an inductance about equal to said desired inductance value, said switching network and said inductors integrated together on a common substrate, said switching network comprising a plurality of micro-electromechanical (MEM) switches, each of said MEM switches switching in response to a respective control signal to set the inductance of said network to one of a plurality of levels.

21. The method of claim 20, wherein said step of operating a switching network is performed by a control device arranged to operate said switching network in response to an external input.

22. The method of claim 20, wherein said step of operating a switching network is performed by a control device connected to a memory device which stores the switching network configuration necessary to achieve said desired inductance value.

23. The method of claim 20, wherein said switching network includes a respective pair of switches for each of said inductors, each inductor connected in series between its respective switch pair, said pairs of switches operable to completely isolate their respective inductors from said inductance network, each of said pairs of switches implemented with a single double-throw micro-electromechanical switch.

24. An inductor integrated with a micro-electromechanical (MEM) switch, comprising:
a substrate,
a first layer which comprises a bottom electrode for a MEM switch, at least one gapped signal line, and a center tap for an inductor, said first layer located on the surface of said substrate,
a second layer which comprises a contact electrode for said MEM switch and the coils for said inductor, said second layer located above said first layer,
a third layer which comprises a cantilever arm for said MEM switch, said third layer located above said second layer, and
a fourth layer which comprises a top electrode for said MEM switch, said fourth layer located above said third layer.

25. The integrated inductor and MEM switch of claim 24, wherein said substrate is a semi-insulating gallium arsenide (GaAs) substrate.

* * * * *